US011869925B2

(12) United States Patent
Cook et al.

(10) Patent No.: US 11,869,925 B2
(45) Date of Patent: Jan. 9, 2024

(54) 3D PRINTED SEMICONDUCTOR PACKAGE

(71) Applicant: Texas Instruments Incorporated, Dallas, TX (US)

(72) Inventors: Benjamin Stassen Cook, Los Gatos, CA (US); Daniel Lee Revier, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 3 days.

(21) Appl. No.: 17/163,766

(22) Filed: Feb. 1, 2021

(65) Prior Publication Data

US 2021/0151551 A1 May 20, 2021

Related U.S. Application Data

(62) Division of application No. 16/236,106, filed on Dec. 28, 2018, now Pat. No. 10,910,465.

(51) Int. Cl.
*H01L 21/56* (2006.01)
*H01L 49/02* (2006.01)
*H01L 23/31* (2006.01)
*H01L 23/66* (2006.01)

(52) U.S. Cl.
CPC ............. *H01L 28/10* (2013.01); *H01L 21/56* (2013.01); *H01L 23/3107* (2013.01); *H01L 23/66* (2013.01); *H01L 2223/6677* (2013.01)

(58) Field of Classification Search
CPC ..... H01L 28/10; H01L 21/56; H01L 23/3107; H01L 23/66; H01L 2223/6677
USPC ........................................................ 257/531
See application file for complete search history.

(56) References Cited

U.S. PATENT DOCUMENTS

| 6,833,627 | B2 * | 12/2004 | Farnworth | ............ | H01L 21/561 |
|---|---|---|---|---|---|
| | | | | | 257/E23.125 |
| 7,216,009 | B2 | 5/2007 | Farnworth et al. | | |
| 7,951,422 | B2 | 5/2011 | Pan et al. | | |
| 8,048,814 | B2 | 11/2011 | Meisel et al. | | |
| 8,632,702 | B2 | 1/2014 | Hieslmair et al. | | |

(Continued)

FOREIGN PATENT DOCUMENTS

| FR | 2848724 A1 | 6/2004 |
|---|---|---|
| WO | 2009131587 A1 | 10/2009 |

*Primary Examiner* — Tu-Tu V Ho
(74) *Attorney, Agent, or Firm* — Frank D. Cimino

(57) ABSTRACT

In described examples, a method for fabricating a semiconductor device and a three dimensional structure, and packaging them together, includes: fabricating the integrated circuit on a substrate, immersing the substrate in a liquid encapsulation material, and illuminating the liquid encapsulation material to polymerize the liquid encapsulation material. Immersing the semiconductor device is performed to cover a layer of a platform in the liquid encapsulation material. The platform is a lead frame, a packaging substrate, or the substrate. The illuminating step targets locations of the liquid encapsulation material covering the layer. Illuminated encapsulation material forms solid encapsulation material that is fixedly coupled to contiguous portions of the semiconductor device and of the solid encapsulation material. The immersing and illuminating steps are repeated until a three dimensional structure is formed. The integrated circuit and the three dimensional structure are encapsulated in a single package.

16 Claims, 11 Drawing Sheets

(56) References Cited

U.S. PATENT DOCUMENTS

| | | | |
|---|---|---|---|
| 8,900,915 B2 | 12/2014 | Rockenberger et al. | |
| 8,912,083 B2 | 12/2014 | Liu et al. | |
| 9,006,720 B2 | 4/2015 | Chiruvolu et al. | |
| 9,475,695 B2 | 10/2016 | Li et al. | |
| 9,646,874 B1 | 5/2017 | Wojciechowski et al. | |
| 9,887,313 B2 | 2/2018 | Mader et al. | |
| 2003/0090006 A1* | 5/2003 | Farnworth | B33Y 80/00 264/494 |
| 2008/0044964 A1 | 2/2008 | Kamath et al. | |
| 2008/0138955 A1 | 6/2008 | Ye et al. | |
| 2008/0171425 A1 | 7/2008 | Poplavskyy et al. | |
| 2010/0115672 A1 | 5/2010 | Mirkin et al. | |
| 2010/0221016 A1* | 9/2010 | Tanaka | G02B 6/4214 257/E33.056 |
| 2010/0237495 A1 | 9/2010 | Pagaila et al. | |
| 2011/0240997 A1 | 10/2011 | Rockenberger et al. | |
| 2013/0105806 A1 | 5/2013 | Liu et al. | |
| 2013/0160833 A1 | 6/2013 | Loscutoff et al. | |
| 2014/0124794 A1 | 5/2014 | Weihua et al. | |
| 2014/0151706 A1 | 6/2014 | Liu et al. | |
| 2014/0170800 A1 | 6/2014 | Loscutoff et al. | |
| 2015/0004375 A1 | 1/2015 | Hou et al. | |
| 2015/0035091 A1 | 2/2015 | Ziglioli | |
| 2016/0218175 A1 | 7/2016 | Carothers et al. | |
| 2017/0092547 A1 | 3/2017 | Tang et al. | |
| 2017/0117356 A1 | 4/2017 | Carothers et al. | |
| 2017/0197823 A1 | 7/2017 | Wachtler et al. | |
| 2018/0166583 A1 | 6/2018 | Cho et al. | |
| 2019/0311950 A1 | 10/2019 | Mehandru | |

* cited by examiner

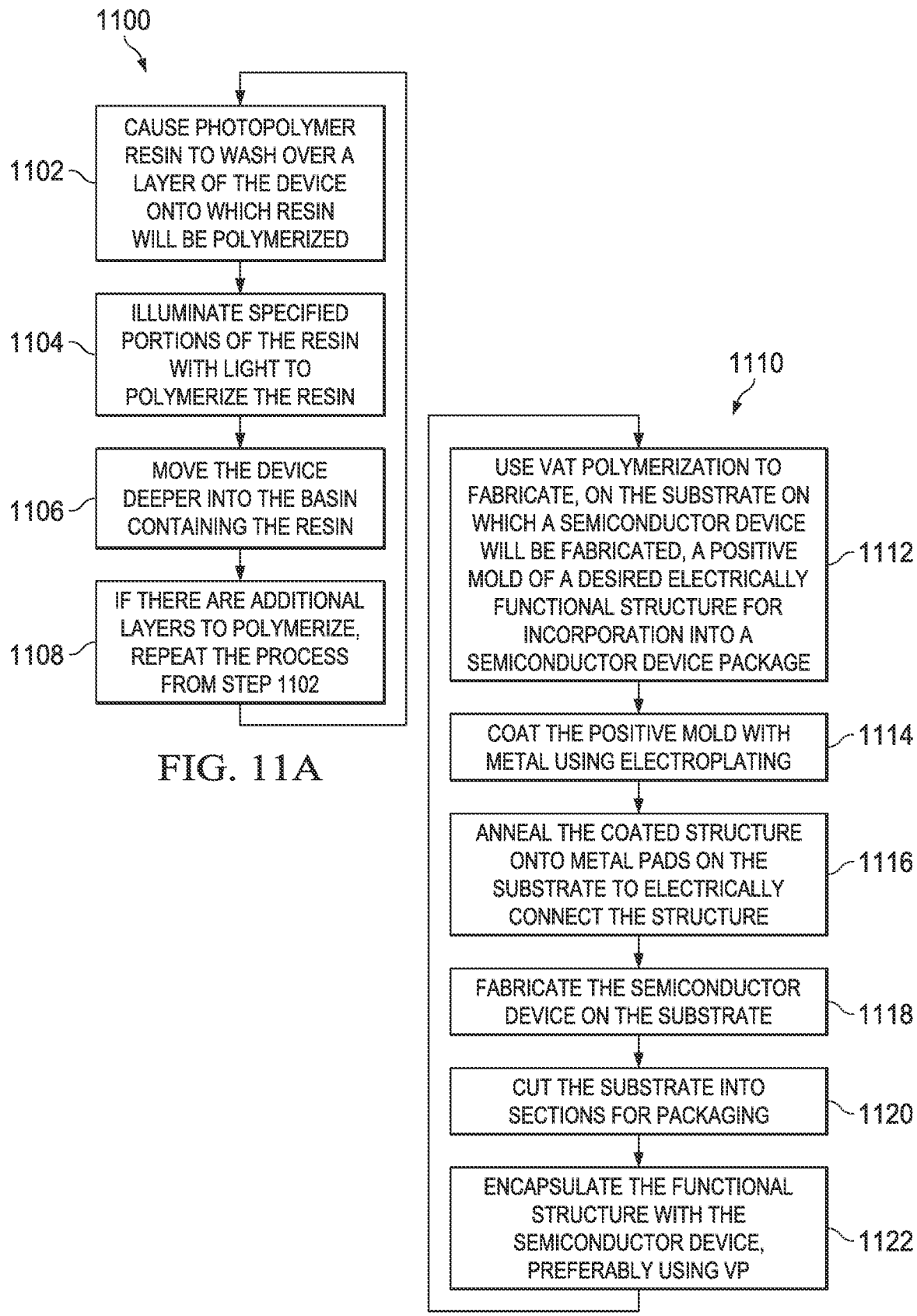

3D PRINTED SEMICONDUCTOR PACKAGE

CROSS-REFERENCE TO RELATED APPLICATION

This application is a divisional of U.S. patent application Ser. No. 16/236,106 filed Dec. 28, 2018, which is incorporated herein by reference.

BACKGROUND

This relates to packaging of semiconductor devices, and more particularly to encapsulating semiconductor device packages.

FIG. 1 shows an example view 100 of an object 102 being formed with vat photopolymerization (VP). VP is also called, for example, stereolithography apparatus (SLA), digital light processing (DLP), scan, spin and selectively photocure (3SP), and continuous liquid interface production (CLIP). VP can be used to make 3D objects in desired shapes. In VP, an object 102 is fabricated using a basin 104 containing a fluid bath of liquid photopolymer resin 106 (the object 102 shown corresponds to a design for an object in the process of being fabricated). The resin 106 is cured at selective locations for a given surface layer of the resin 106 and using targeted light exposure from a light source 108. For example, using DLP (digital light processing, which uses digitally controlled micromirrors) to control illumination and curing of the resin 106, photon sources 110 can be targeted to locations at the surface of the resin 106 bath. Targeting is accomplished using precisely controlled micromirrors 112 (such as using DLP or mirror galvanometers). After a layer of resin 106 is cured corresponding to a cross-section of the designed object, the object-in-process (the layers already fabricated) can be moved away (i.e., downward or upward) from the surface of the resin 106, and the resin 106 can be selectively illuminated and cured to fabricate the next layer (cross-section) of the designed object.

SUMMARY

In described examples, a method for fabricating a semiconductor device and a three dimensional structure, and packaging them together, includes: fabricating the integrated circuit on a substrate, immersing the substrate in a liquid encapsulation material, and illuminating the liquid encapsulation material to polymerize the liquid encapsulation material. Immersing the semiconductor device is performed to cover a layer of a platform in the liquid encapsulation material. The platform is a lead frame, a packaging substrate, or the substrate. The illuminating step targets locations of the liquid encapsulation material covering the layer. Illuminated encapsulation material forms solid encapsulation material that is fixedly coupled to contiguous portions of the semiconductor device and of the solid encapsulation material. The immersing and illuminating steps are repeated until a three dimensional structure is formed. The integrated circuit and the three dimensional structure are encapsulated in a single package.

BRIEF DESCRIPTION OF THE DRAWINGS

FIG. 11A shows an example of a process for encapsulation of a semiconductor device using vat polymerization.

FIG. 11B shows an example of a process for incorporation into a semiconductor device package of three-dimensional structures plated onto VP-formed positive molds.

DETAILED DESCRIPTION OF EXAMPLE EMBODIMENTS

Figure 1:
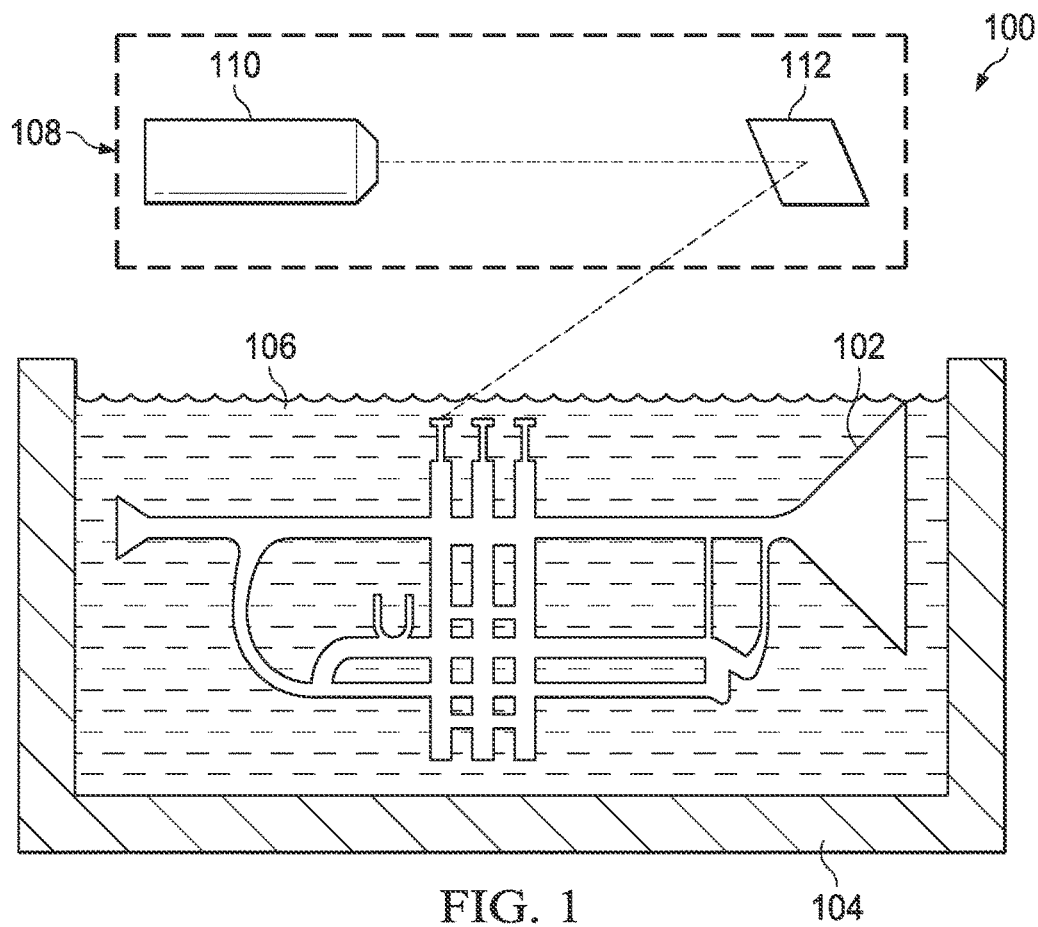
FIG. 1 shows an example view of an object being formed with vat photopolymerization (VP).
Figure 2A:
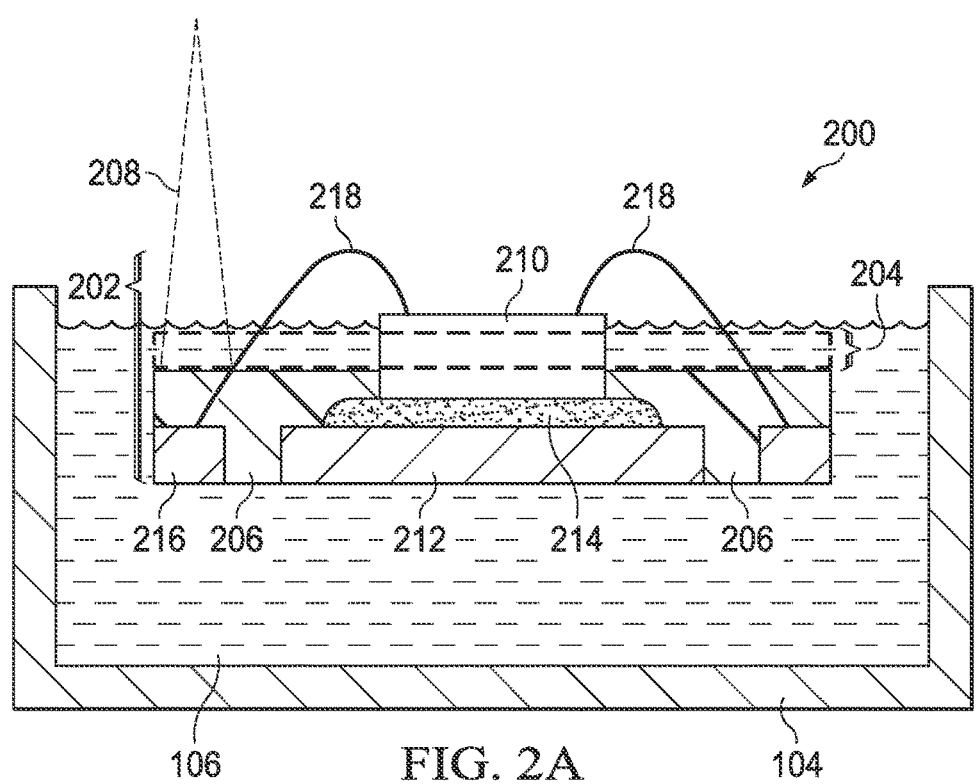
FIG. 2A schematically shows an example of a cross-sectional view of semiconductor device encapsulation using top-down VP.

FIG. 2A schematically shows an example of a cross-sectional view 200 of semiconductor device 202 encapsulation using top-down VP (vat photopolymerization). As shown in FIG. 2A, in top-down VP, the fluid bath of resin 106 in the basin 104 is preferably (at least) as deep as the intended structure to be fabricated on the target object—the semiconductor device 202—is tall.

Figure 2B:
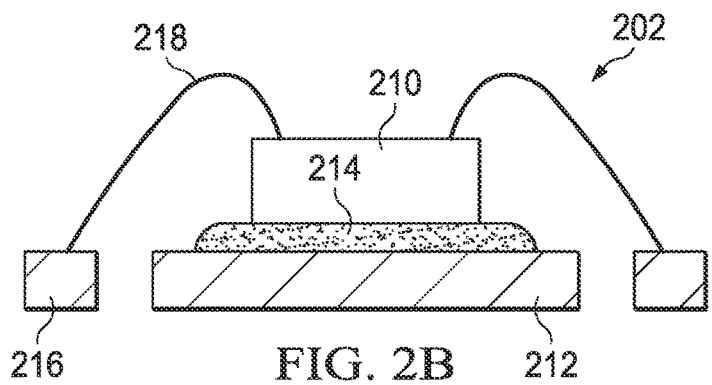
FIG. 2B schematically shows an example of a cross-sectional view of a semiconductor device 202.

FIG. 2B schematically shows an example of a cross-sectional view of a semiconductor device 202. A semiconductor device 202 can comprise, for example, an IC 210 (an integrated circuit, also referred to as a die) mounted on a die pad 212 and fixedly attached to the die pad 212 using an attaching material 214, such as epoxy die attach. The IC 210 is electrically connected to lead fingers 216 by wires 218. In some embodiments, wires 218 can also electrically connect the die pad 212 to the IC 210, and/or electrically connect the die pad 212 to the lead fingers 216. The die pad 212 and lead fingers 216 can be used to connect the IC 210 to a packaging substrate or to a lead frame (such as a quad-flat no-lead frame, or QFN). The lead frame connects the IC 210 to an external system such as the surface of a printed circuit board.

Referring to FIG. 2A, the semiconductor device 202 is attached to a mechanical stage capable of vertical movement and lowered into the resin 106. The IC 210 can be lowered into the basin 104 by lowering in a packaging substrate or lead frame on which the IC 210 is mounted, or the IC 210 itself.) The device 202 starts at a level in the resin 106 bath corresponding to a first layer 204 of resin 106 to be washed onto and then cured onto the device 106. After a layer 204 (as shown, the area within the dotted-line box) of un-cured resin 106 is washed onto the current surface of the device 202 (the surface including polymerized resin 206), selected locations of the layer 204 are exposed to (illuminated/irradiated with) light 208 or some other energy source. The light 208 causes the resin 106 to cure, forming polymerized resin 206, so that the first instance of such a cure commences the encapsulation of cured resin onto device 202. After the layer 204 of resin 106 is cured (polymerized) onto the device 202, the device 202 is lowered, beneath an interface between the liquid photopolymer resin and an atmosphere exterior to the basin 104, by a height interval corresponding to a next layer 204 of resin 106 to be washed and cured onto the device 202. The height interval can correspond to, for example, sizes of features to be created using VP, or VP feature size limits, or feature sizes of structures on the device 202. Resin 106 can be cured with features sizes of, for example, 20 μm to 200 μm.

As layers of resin 106 are cured to form additional encapsulation and the device 202 is further submerged incrementally, layer 204 by layer 204, in the resin 106 bath, the photopolymer resin 106 may not fully wash over—or may wash over in excess—a portion of the device 202 currently being targeted for material deposition. Prior to curing, a doctor blade (similar to doctor blades used in rotogravure printing) can be used to sweep photopolymer resin 106 onto the device 202 if the layer 204 currently being processed is not fully covered, and/or to sweep excess resin 106 back into the basin 104. Alternatively, ultrasonic energy can be used to break up surface tension of the resin 106, enabling the resin 106 to find its lowest energy position on the semiconductor device 202 (preferably, evenly coating the layer 204 currently being processed). Repeated cures of successive layers 204 of resin 106 washed onto the device 202 can be used to encapsulate the device 202 and thereby create an overmold 220 (shown in FIG. 2C) comprising polymerized resin 206.

A resin 106 can include, for example, monomers, dimers, trimers, or larger arrangements of polymers, which can be cross-linked using applied energy. Energy can be applied using, for example, light, heat, ion beams or electron beams. The polymerizing portion of the resin 106 can include various materials, such as acrylate, epoxy or polyimides. The resin 106 can also include filler particles which are, for example, 1 nm to 100 μm in size, composed of, for example, oxides, carbon/carbon allotropes, ceramics or metals. Multiple baths with different photopolymers can be used to create a final product comprising multiple different cured materials having different properties (e.g., different hardnesses, textures or heat conduction properties).

Figure 2C:
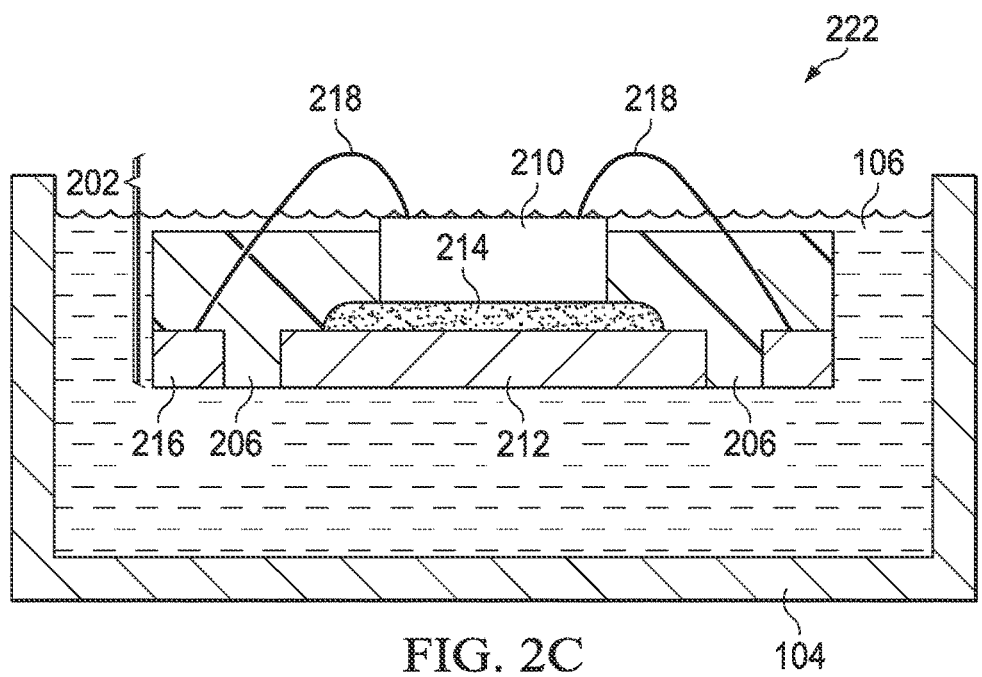
FIG. 2C schematically shows an example of a cross-sectional view of semiconductor device encapsulation using top-down VP.

FIG. 2C schematically shows an example of a cross-sectional view 222 of semiconductor device 202 encapsulation using top-down VP. As shown by the sequence of FIGS. 2A and 2C, exposure of a layer 204 of resin 106 to light 208 results in that layer 204 of resin 106 being cured, forming polymerized resin 206. VP enables fabrication of physically and/or electrically functional structures in die 210 packaging, and, more generally, in semiconductor device 202 packaging.

Figure 2D:
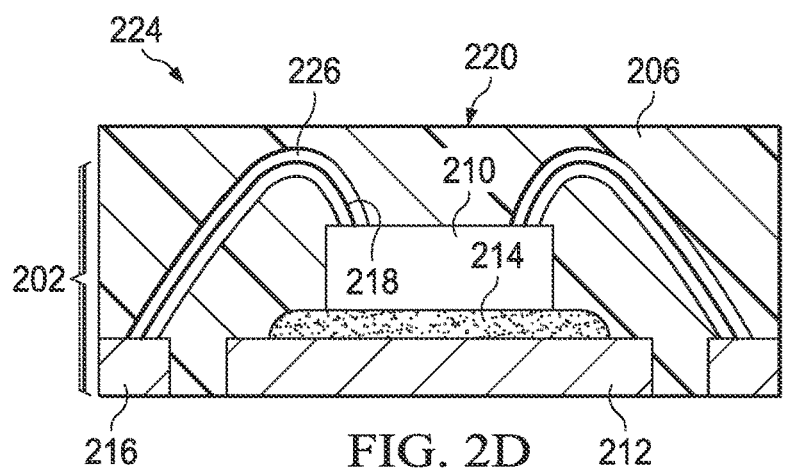
FIG. 2D schematically shows an example of a cross-sectional view of an encapsulated semiconductor device after the device is removed from the polymer resin basin.

FIG. 2D schematically shows an example of a cross-sectional view 224 of an encapsulated semiconductor device 202 after the device 202 is removed from the polymer resin basin 104. The polymerized resin overmold 220 can be fabricated, using selective curing in the top-down VP steps, to create different surface shapes and/or internal cavities. For example, as shown in FIG. 2D, tubular hollow regions 226 can be left around the wires 218 so that the overmold 220 does not contact the wires 218. This helps to prevent wire bend delamination. Also, holes or other cut-out shapes can be formed by leaving uncured selective locations in the polymerized resin 206. Holes can be used to mitigate stress on a die 210 surface caused by, for example, externally applied stressors or as a result of internal deformation caused by thermal variance.

Vat polymerization enables high resolution printing of encapsulation material with three-dimensional features with high throughput. Printable features include cavities and other three-dimensional structures, as further described with respect to, for example, FIGS. 3A through 8 and FIG. 11A. Vat polymerization also enables printing of a variety of three-dimensional shapes, including for use as positive molds for functional features, as further described with respect to, for example, FIGS. 9A, 9B, 10A, 10B, and 11B.

Figure 3A:
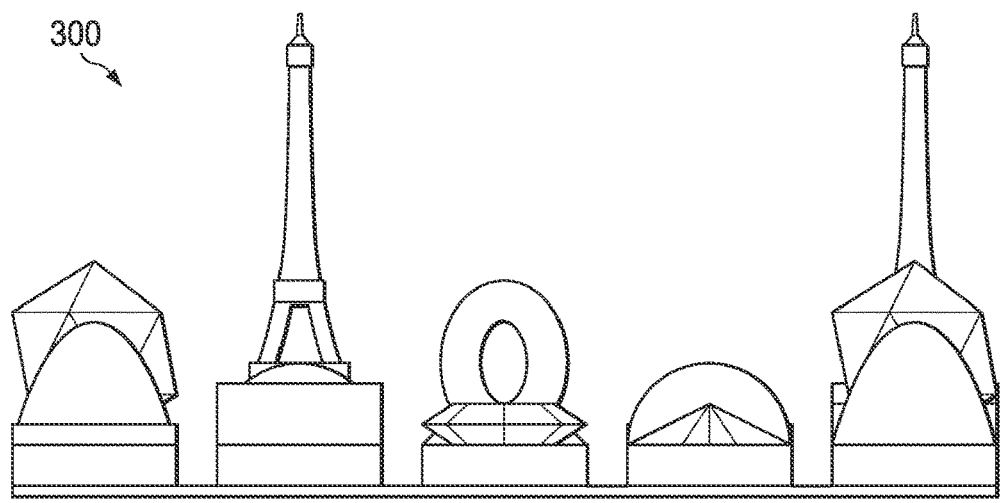
FIG. 3A shows an example of a side elevational view of multiple encapsulated dies on a single substrate.
Figure 3B:
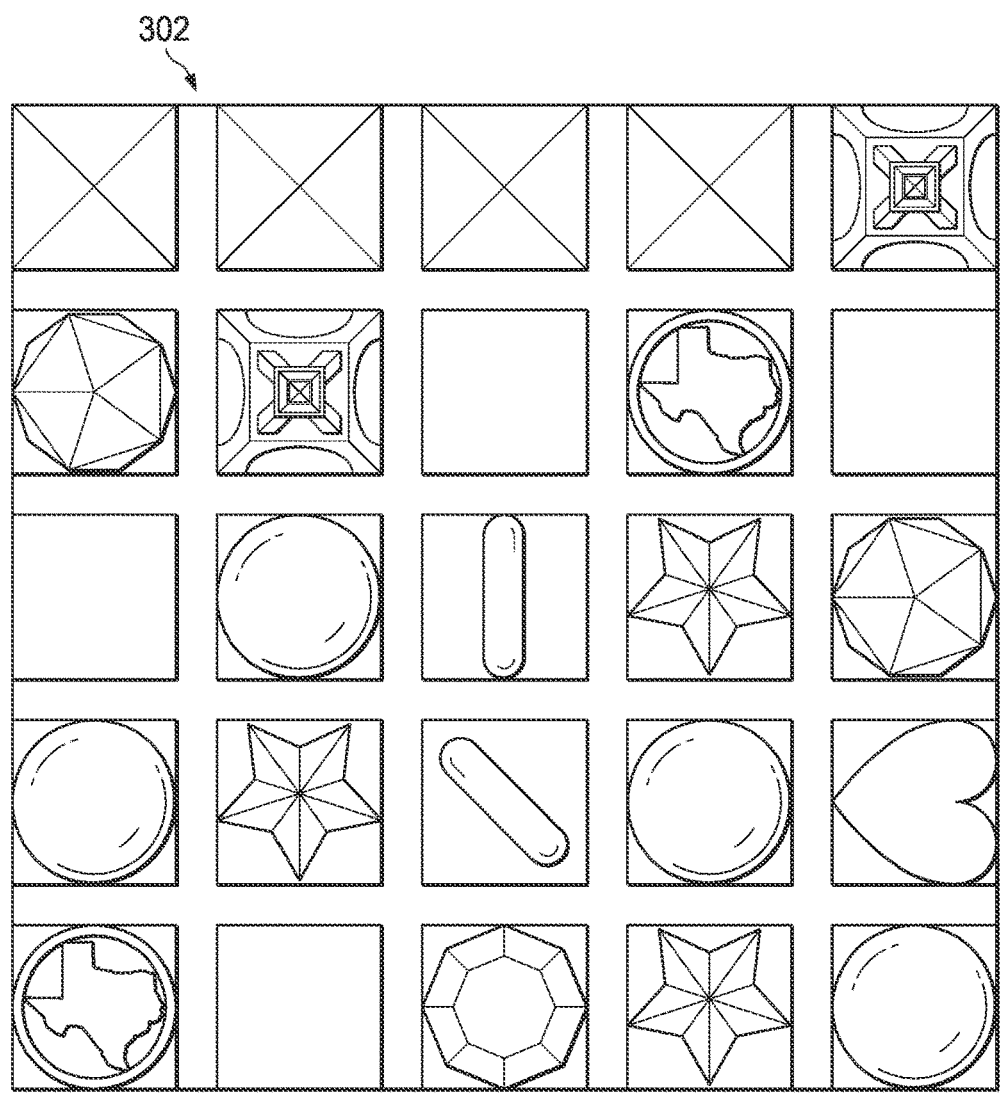
FIG. 3B shows an example of a top-down view of the multiple encapsulated dies on a single substrate of FIG. 3A.
Figure 3C:
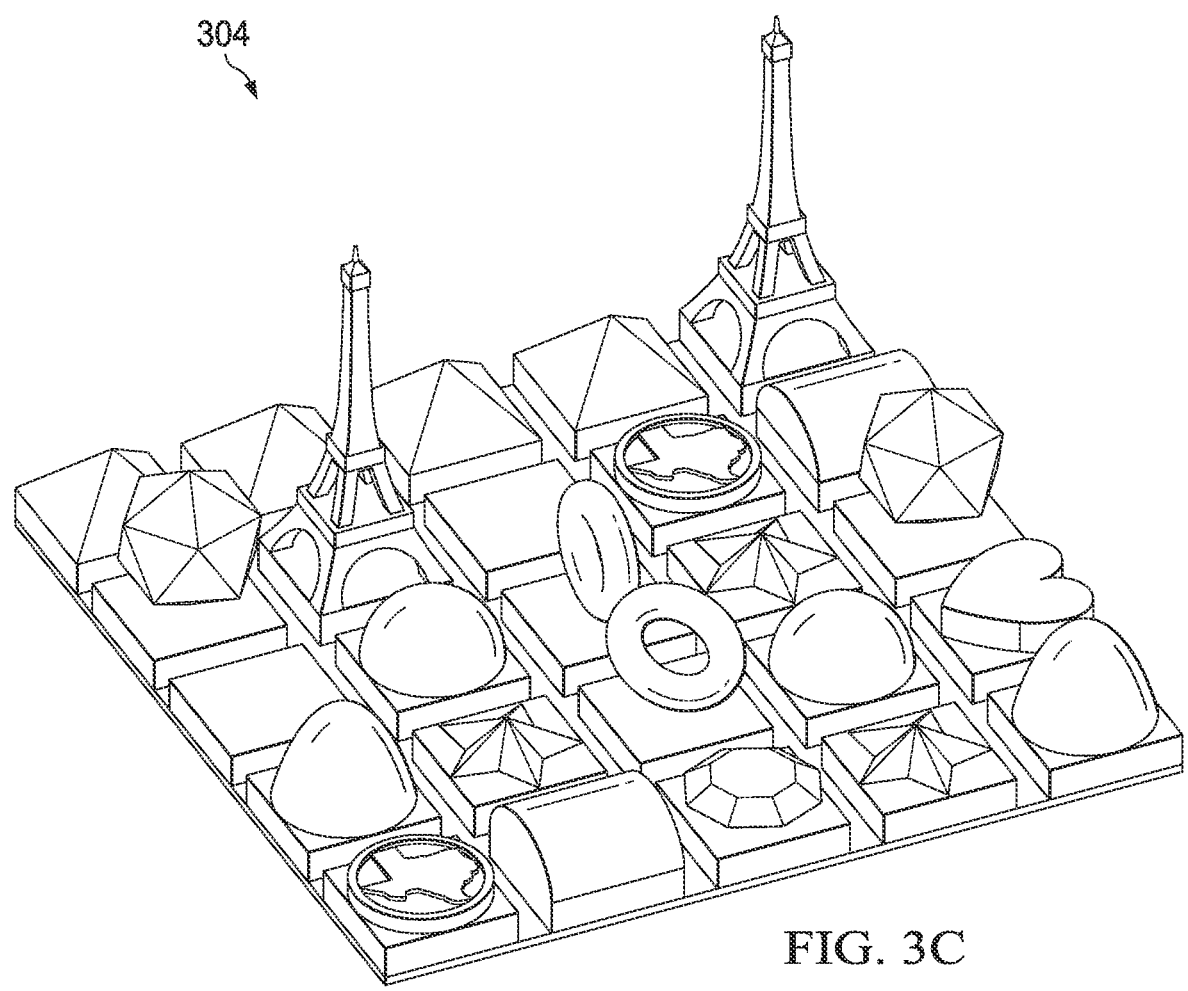
FIG. 3C shows an example of a perspective view of the multiple encapsulated dies on a single substrate of FIG. 3A.

FIG. 3A shows an example of a side elevational view 300 of multiple encapsulated dies 210 on a single substrate 302. FIG. 3B shows an example of a top-down view 304 of the multiple encapsulated dies 210 on a single substrate 302 of FIG. 3A. FIG. 3C shows an example of a perspective view 306 of the multiple encapsulated dies 210 on a single substrate 302 of FIG. 3A. As shown in FIGS. 3A, 3B and 3C, because resin 106 can be polymerized at specified locations, different devices 202 can be encapsulated differently. Accordingly, the polymerized resin 206 encapsulating a device 202 can comprise features that are unique to that device 202, with respect to a run of devices 202 using a same design layout database (specifying device 202 features such as interconnects and doped regions). For example, each device 202 in a fabrication run can comprise an overmold 220, made using polymerized resin 206, with one or more features unique to that device 202 with respect to the other devices 202 in the run. Features which are unique per-device in a production run, and/or which are different for different groups of devices in a production run, can include, for example: a number identifying the part, or its corresponding batch or lot; structure tuning the device's 202 thermal or other performance characteristics pursuant to a customer order; a die-specific identifier; or anti-counterfeit patterns, such as patterns which are internal to (buried under the surface of) respective overmolds 220 and which are unique to each device 202. While in some embodiments an Eiffel Tower may not be a preferred packaging shape, use of Eiffel Towers in FIGS. 3A, 3B and 3C makes a point regarding the versatility of VP as a tool for encapsulation of semiconductor devices 202.

Figure 4:
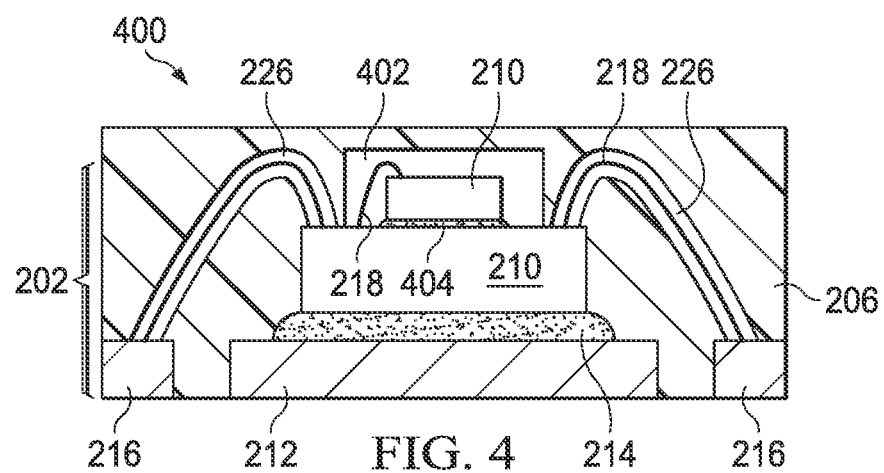
FIG. 4 schematically shows an example of a cross-sectional view of stacked semiconductor dies with a selective cavity around the top die.

FIG. 4 schematically shows an example of a cross-sectional view 400 of stacked semiconductor dies 210 with a selective cavity 402 around the top die 210. As shown in FIG. 4, Dies 210 can be stacked on top of each other within a packaged device 202, with an adhesive 404 (which can be, but is not necessarily, conductive) connecting them, and with a selectively produced cavity 402 (as discussed below with respect to, for example, FIGS. 6A and 6B) surrounding the top die 210. Preferably, dies 210 which are vertically superior (above) to other dies 210 in a stack with respect to a substrate surface (not shown) are successively smaller than dies 210 which are vertically inferior (below) with respect to the substrate surface. Stacked dies 210 can be electrically connected by wires 218. The cavity 402 around the top die 210 prevents stresses applied to the packaged device 202 from affecting performance of the stacked dies 210 (in some embodiments, performance is sensitive to stress), and generally enables higher precision in fabrication and performance.

Figure 5A:
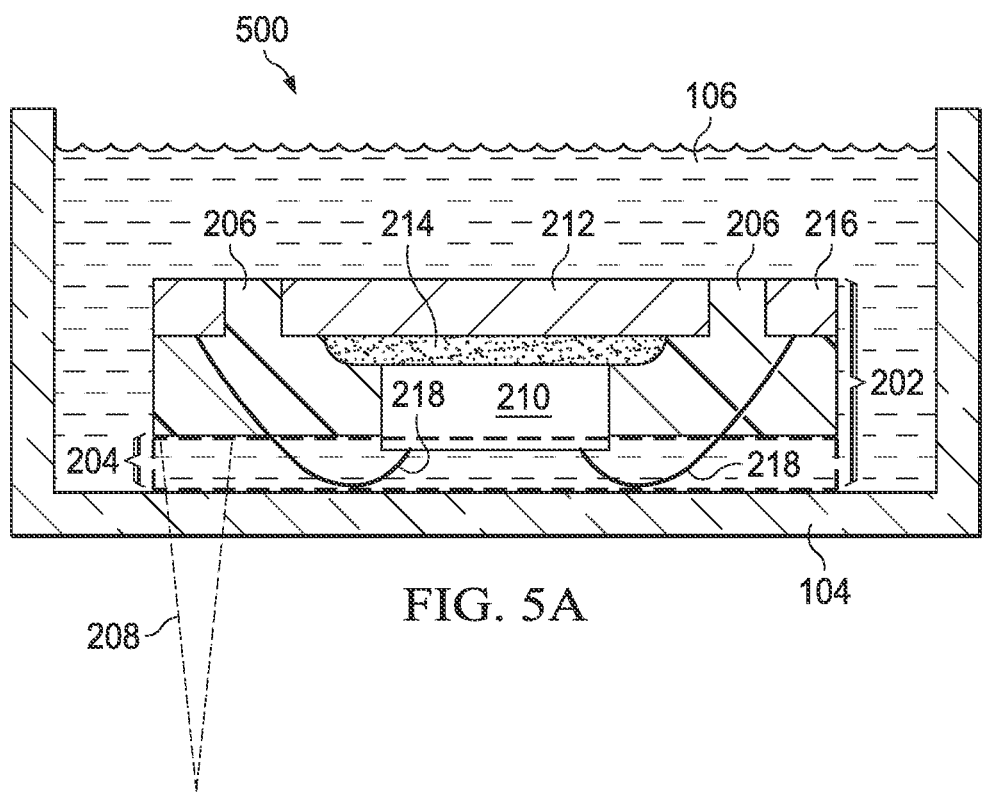
FIG. 5A schematically shows an example of a cross-sectional view of semiconductor device encapsulation using bottom-up VP.

FIG. 5A schematically shows an example of a cross-sectional view 500 of semiconductor device 202 encapsulation using bottom-up VP. In bottom-up VP, the basin 104 is transparent, for example, made of glass. The device 202 is attached to a mechanical stage capable of vertical movement and submerged in the resin 106, with the portion of the device 202 to be illuminated (to thereby cure contiguous resin 106) facing a wall of the basin 104 (preferably, the bottom of the basin 104) and held at a distance from that wall such that a layer 204 of resin 106 is available to be cured in specified locations.

As shown in FIG. 5A, the resin 106 in a current layer 204 is irradiated, and then pried off the glass/polymer connection between newly polymerized resin 206 and the basin 104 wall (for example, using a shimmying motion). The device 202 is then raised (moved away from an interface between the liquid photopolymer resin and the basin 104 wall) so that resin 106 is available to (preferably, only to) the next layer 204 to be treated, and the process is repeated.

Figure 5B:
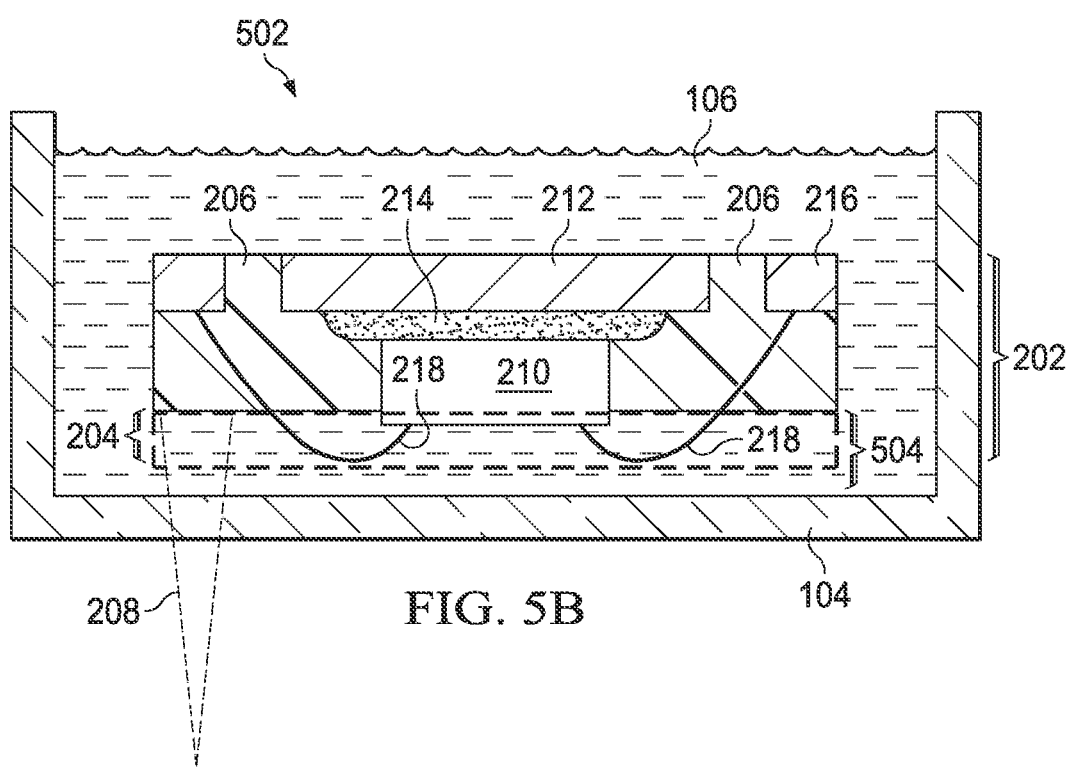
FIG. 5B schematically shows an example of a cross-sectional view of semiconductor device encapsulation using bottom-up VP.

FIG. 5B schematically shows an example of a cross-sectional view 502 of semiconductor device 202 encapsulation using bottom-up VP. As shown in FIG. 5B, a transparent wall of the basin 104 can comprise an $O_2$ permeable glass ($O_2$ will typically inhibit the polymerization reaction of the resin 106) or other reaction inhibitor. Using a basin 104 with walls comprising, treated with, or transmitting a polymerization inhibitor creates a region 504 near the basin 104 walls where polymerization will not occur (or occurs much more slowly), despite illumination by the light source 208. This enables encapsulating polymerization to occur away from the basin 104 walls, avoiding shimmying (or otherwise stressing) the device 202 to separate newly-formed polymerized resin 206 from the basin 104 walls. Relevant subject matter describing bottom-up fabrication techniques using a polymerizable liquid can be found in U.S. Pat. Pub. No. 2014/0361463, which is incorporated herein by reference.

Figure 6A:
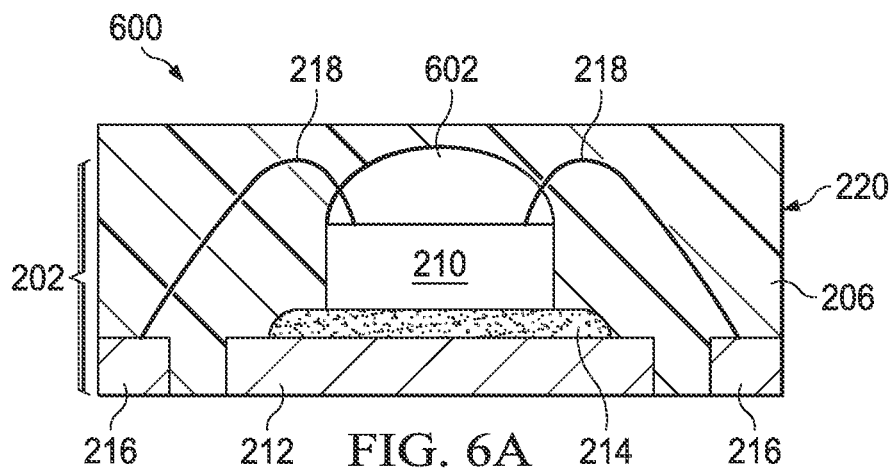
FIG. 6A schematically shows an example of a cross-sectional view of an encapsulated semiconductor device.

FIG. 6A schematically shows an example of a cross-sectional view 600 of an encapsulated semiconductor device 202. As shown in FIG. 6A, a cavity 602, filled with air or another gas or liquid (or mixture), can be fabricated around the die 210 using VP. The cavity 602 can be configured to prevent stress from package flexion due to, for example, thermal expansion.

Figure 6B:
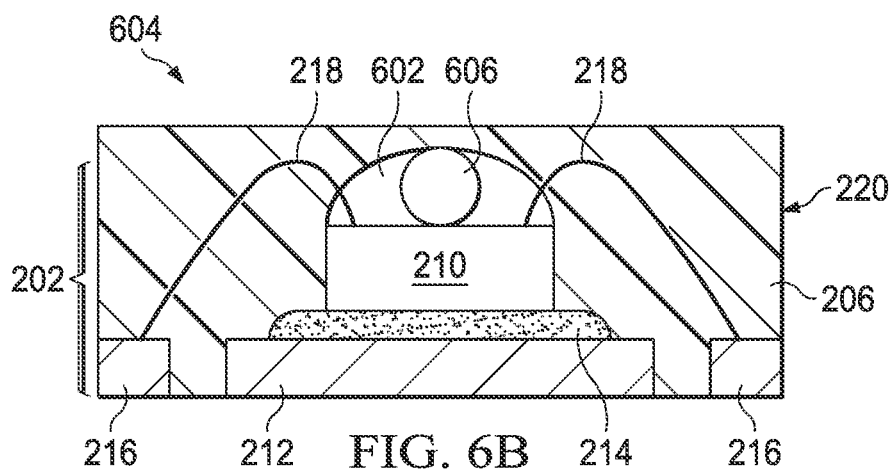
FIG. 6B schematically shows an example of a cross-sectional view of a semiconductor device encapsulated using VP.

FIG. 6B schematically shows an example of a cross-sectional view 604 of a semiconductor device 202 encapsulated using VP. As shown in FIG. 6B, using VP, a cavity 602 can be fabricated around the die 210 (during encapsulation) to contain an object 606—accordingly, a selected three dimensional structure which is connected or unconnected to the body of the encapsulating material (the overmold 220). The contained object can be, for example, a sensor component, such as a ball for an accelerometer. The object 606 can be made of any solid material—preferably, a material which will not react with the polymerized resin 206—such as polymerized resin 206, a metal, a ceramic, a plastic or a semiconductor.

During VP, the device 202 can be removed from and re-immersed into the resin 106 bath between deposition of layers 204. This provides an opportunity to drain cavities 602, (optionally) fill them with a gas, liquid, solid material, object, or a combination thereof, and cap (enclose) the cavities.

Figure 7A:
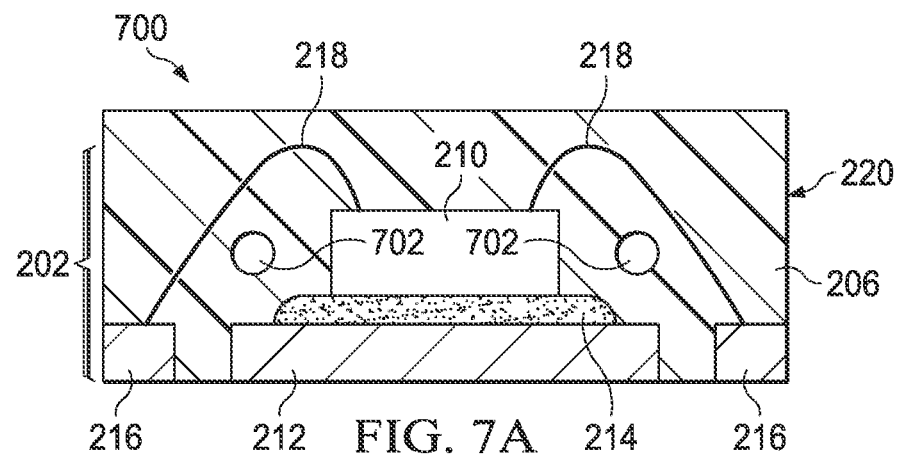
FIG. 7A schematically shows an example of a cross-sectional view of a semiconductor device encapsulated using VP.

FIG. 7A schematically shows an example of a cross-sectional view 700 of a semiconductor device 202 encapsulated using VP. As shown in FIG. 7A, material can be polymerized using VP in patterned layers that leave internal channels 702 in the encapsulating polymerized resin 206. These channels can be configured to enable, for example, microfluidics, which can be used to cool the device 202. Similarly, vertical channels can be used as light pipes, to enable direct emissions and/or sensing by the device 202. This can be used for (for example) light emitting junctions, sensors, and communications.

Figure 7B:
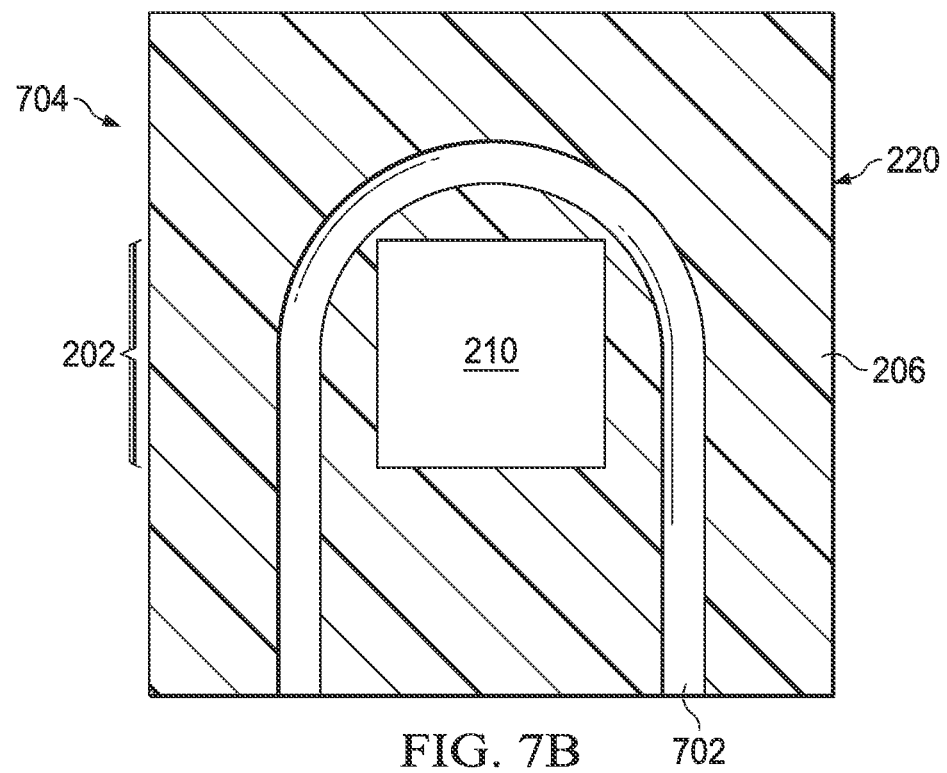
FIG. 7B schematically shows an example of a top-down cross-sectional view of a semiconductor device encapsulated using VP.

FIG. 7B schematically shows an example of a top-down cross-sectional view 704 of a semiconductor device 202 encapsulated using VP. As shown in FIG. 7B, microfluidic channels 702 can lead into and out of an overmold 220 encapsulating a device 202. Microfluidic channels 702 can be used to distribute a cooling medium into and out of the device 202.

Figure 8:
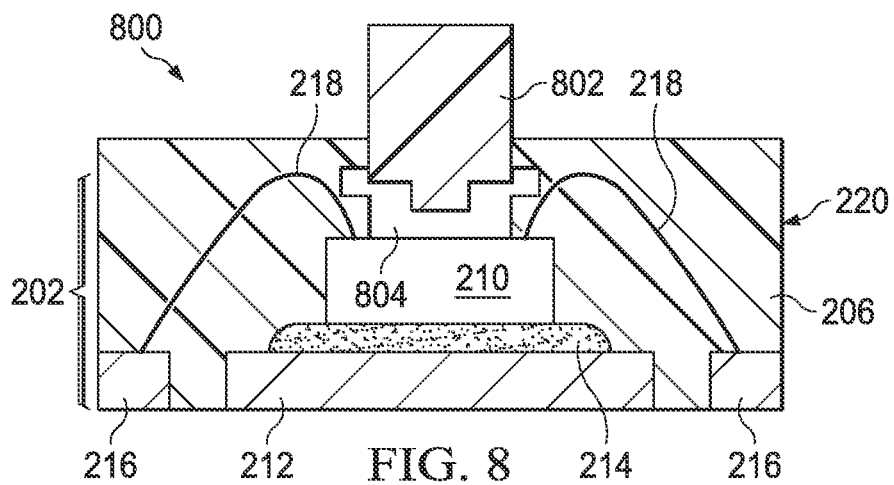
FIG. 8 schematically shows an example of a cross-sectional view of a semiconductor device encapsulated using VP.

FIG. 8 schematically shows an example of a cross-sectional view 800 of a semiconductor device 202 encapsulated using VP. As shown in FIG. 8, VP can be used to create a button 802 and an empty space 804 underneath the button 802. The button 802 can be configured to toggle a state of the device 202, enabling the packaged device 202 itself to be used as, for example, an input/output (I/O) device.

Figure 9A:
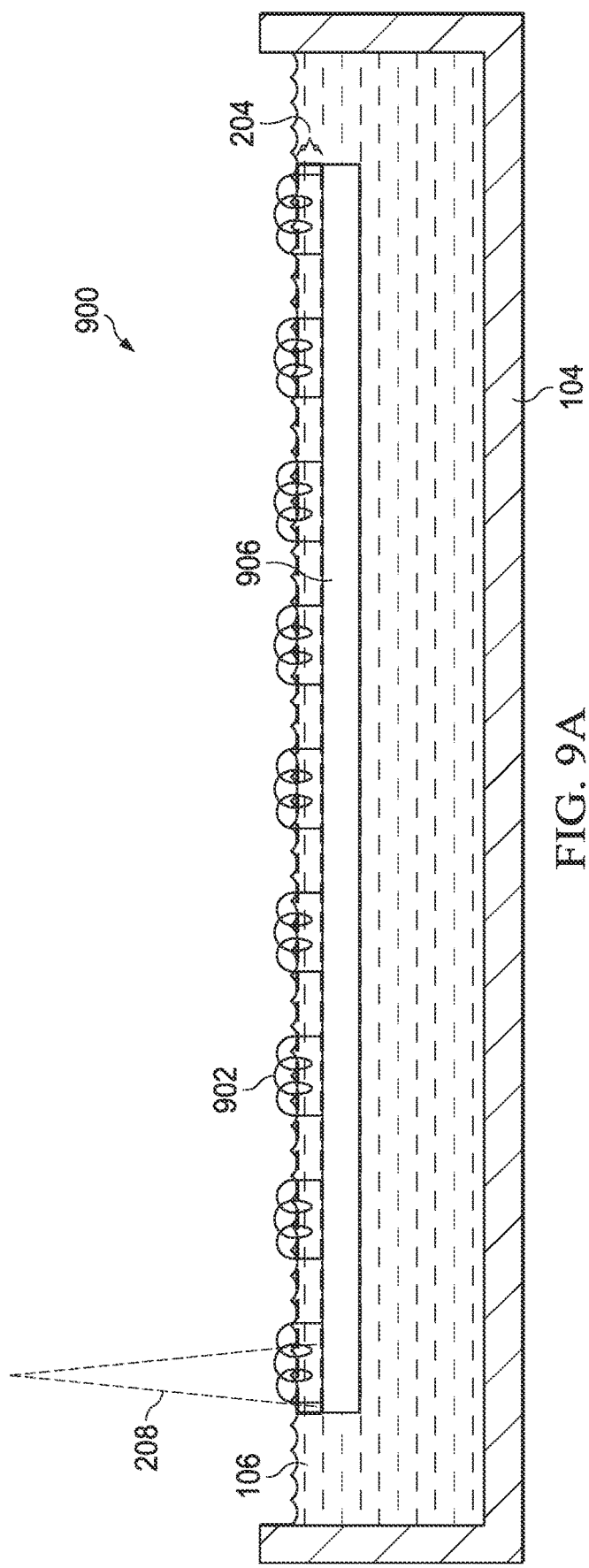
FIG. 9A schematically shows an example of a cross-sectional view of fabrication, using VP, of positive molds used to fabricate inductors on the same substrate as used for fabrication of integrated circuits.
Figure 9B:
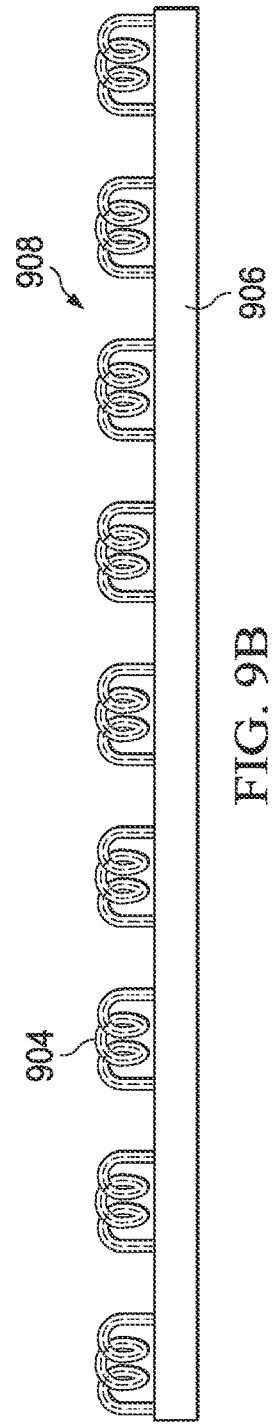
FIG. 9B schematically shows an example of a cross-sectional view of inductors fabricated on a substrate on which integrated circuits are also fabricated.

FIG. 9A schematically shows an example of a cross-sectional view 900 of fabrication, using VP, of positive molds 902 used to fabricate inductors 904 (shown in FIG. 9B, not in FIG. 9A) on the same substrate 906 as used for fabrication of integrated circuits 210 (not shown). A positive mold typically includes a cutout shape which is filled with a liquid substance that is poured into the cutout and hardens in the shape of the cutout. A positive mold is essentially a scaffold constructed in the desired shape, so that a substance coated onto the positive mold will assume the desired shape. FIG. 9B schematically shows an example of a cross-sectional view 908 of inductors 904 fabricated on a substrate 906 on which integrated circuits 210 (not shown) are also fabricated.

As shown in FIGS. 9A and 9B, VP can be used to create positive molds 902 of inductors 904 on the surface of a wafer or other substrate 906 on which integrated circuits 210, comprising functional electronic components (for example, a processing device, such as switching and other components comprising a DC-DC power converter), are also fabricated. The positive molds 902 comprise polymerized resin 206, shaped such that metallizing techniques (such as electroplating) can be used to coat the polymerized resin 206 with a selected metal (or other appropriate material) to create inductors 904, as shown in FIG. 9B. To form inductors 904, positive molds can be coated with, for example, the same metal(s) as used to make one or more metal stack layers, and an exterior layer can comprise passivation.

The resin 106 used to form the positive molds 902 preferably includes a catalyst such that the polymerized resin 206 in the positive molds 902 enables and/or improves coating of the positive molds 902 with the coating material. Coating of the positive molds 902 can be performed using, for example, electroplating, with design rules selected such that the resulting inductor 904 is functional (for example, avoiding short circuits). Mass transport theory can be used to facilitate such design. Cladding is preferably followed by laying down an insulating layer over the coating material using, for example, chemical vapor deposition.

The inductors 904 can then be heated (annealed) to form conductive bonds with metal pads on their carrying substrate 906. The substrate 906 can subsequently be cut so that an inductor remains electrically connected to a respective IC 210, facilitating packaging of inductors 906 as part of an integrated semiconductor device 202. Inductors 906 fabricated as shown in FIGS. 9A and 9B can be encapsulated with an IC 210 using VP processes as described with respect to FIGS. 2A, 2B, 4, 5A, and 5B.

Inductors 906 and other functional structures fabricated as shown in FIGS. 9A and 9B (such as antennas 1002, as described with respect to FIG. 10A, or other functional 3D structures, as described with respect to FIG. 10B) can be fabricated on the same die 210, a different die 210, or on the same lead frame or packaging substrate as the die 210 included in a co-encapsulated semiconductor device 202 (as shown in FIG. 2A).

Figure 9C:
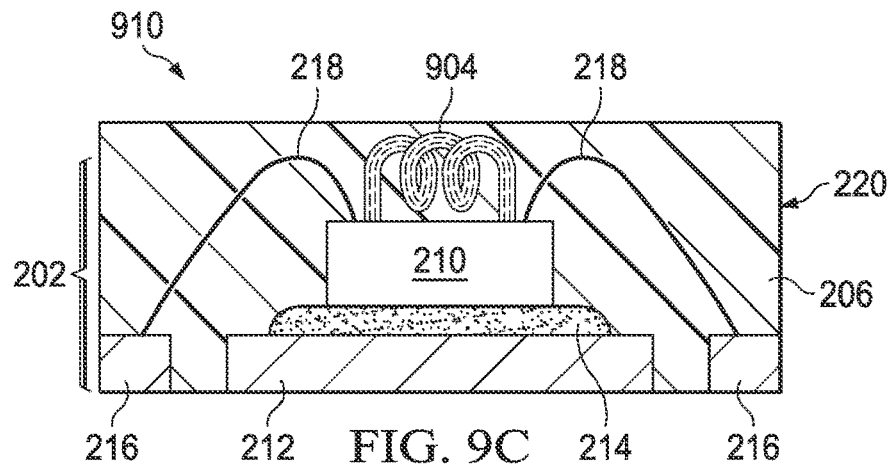
FIG. 9C schematically shows an example of a cross-sectional view of a device with an inductor integrated on the same substrate surface, and incorporated into the same encapsulated package, as an IC.

FIG. 9C schematically shows an example of a cross-sectional view 910 of a device 202 with an inductor 904 integrated on the same substrate 906 (not shown) surface, and incorporated into the same encapsulated package, as an IC 210.

Figure 10A:
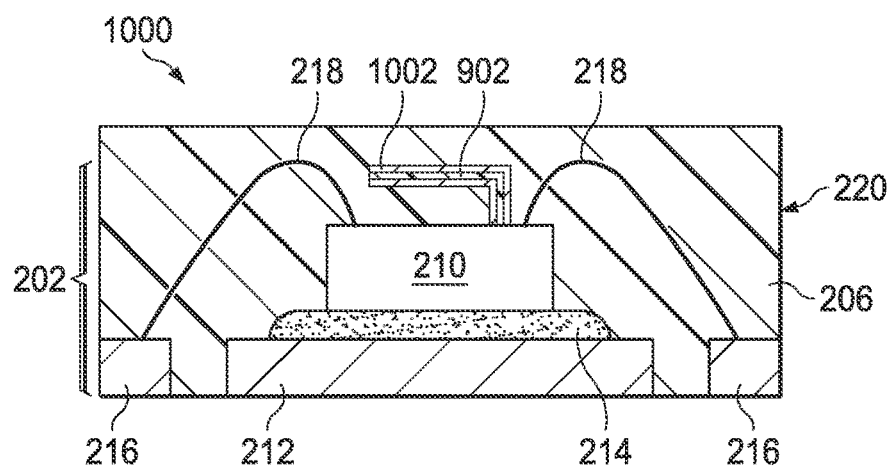
FIG. 10A schematically shows a cross-section of an example of a semiconductor device with an antenna integrated into the same encapsulated package, and on the same substrate, as an IC.

FIG. 10A schematically shows a cross-section of an example 1000 of a semiconductor device 202 with an antenna 1002 integrated into the same encapsulated package, and on the same substrate 906 (not shown), as an IC 210. Use of VP to create a positive mold 902 for then forming an antenna 1002 enables fabrication of the antenna 1002 on-die of a specified length, and with a sufficient separation between the receiving and/or transmitting arm of the antenna 1002 and the IC 210 to enable efficient antenna 1002 function. After the antenna 1002 is fabricated, it can be annealed (heated) to create an electrical connection to a metal pad on the IC 210 on which the antenna 1002 is fabricated.

Figure 10B:
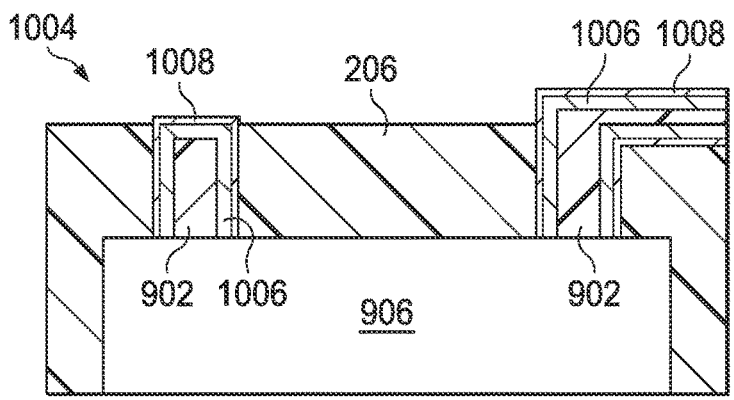
FIG. 10B schematically shows a cross-section of an example of a semiconductor device with specified three-dimensional shapes integrated into the same encapsulated package, and on the same substrate, as an IC.

FIG. 10B schematically shows a cross-section of an example 1004 of a semiconductor device 202 with specified three-dimensional shapes 1006 integrated into the same encapsulated package, and on the same substrate 906, as an IC 210 (not shown). As shown, VP can be used to fabricate a variety of three dimensional shapes 1006 on-die, which can then be included for encapsulation in a single package with an IC 210 containing electrically functional circuits. VP can be used to create positive molds 902 using polymerized resin 206. The positive molds 902 are then coated with a desired surface material 1008. A surface material 1008 coating can include a metal coating fabricated using electroplating, thereby completing the three-dimensional shape 1006.

FIG. 11A shows an example of a process 1100 for encapsulation of a semiconductor device 202 using vat polymerization. As shown in FIG. 11A, photopolymer resin 106 is caused to wash over a layer of the device 202 onto which resin 106 will be polymerized in step 1102. Specified portions of the resin 106 are then irradiated with light 208 to polymerize the resin 106 in step 1104. After polymerization, the device 202 is moved deeper into the basin 104 containing the resin 106 (move the device 202 down into the basin 104 in top-down VP, and upwards from the bottom of the basin 104 in bottom-up VP) in step 1106. If there are additional layers 204 to polymerize, the process is then repeated from step 1102.

FIG. 11B shows an example of a process 1110 for incorporation into a semiconductor device package 202 of three-dimensional structures plated onto VP-formed positive molds. As shown in FIG. 11B, vat polymerization is used to fabricate, on the substrate 906 on which, or in connection with, a semiconductor device 202 will be fabricated, a positive mold 902 of a desired electrically functional structure for incorporation into a semiconductor device package, in step 1112. The positive mold 902 is coated with metal using electroplating in step 1114. The coated structure is then annealed onto metal pads on the substrate 1108 to electrically connect the structure in step 1116. The semiconductor device 202 is subsequently fabricated on the substrate 906 in step 1118. The substrate 906 is cut into sections for packaging in step 1120, and the functional structure is encapsulated (packaged) with the semiconductor device, preferably using VP, in step 1122.

Figure 12:
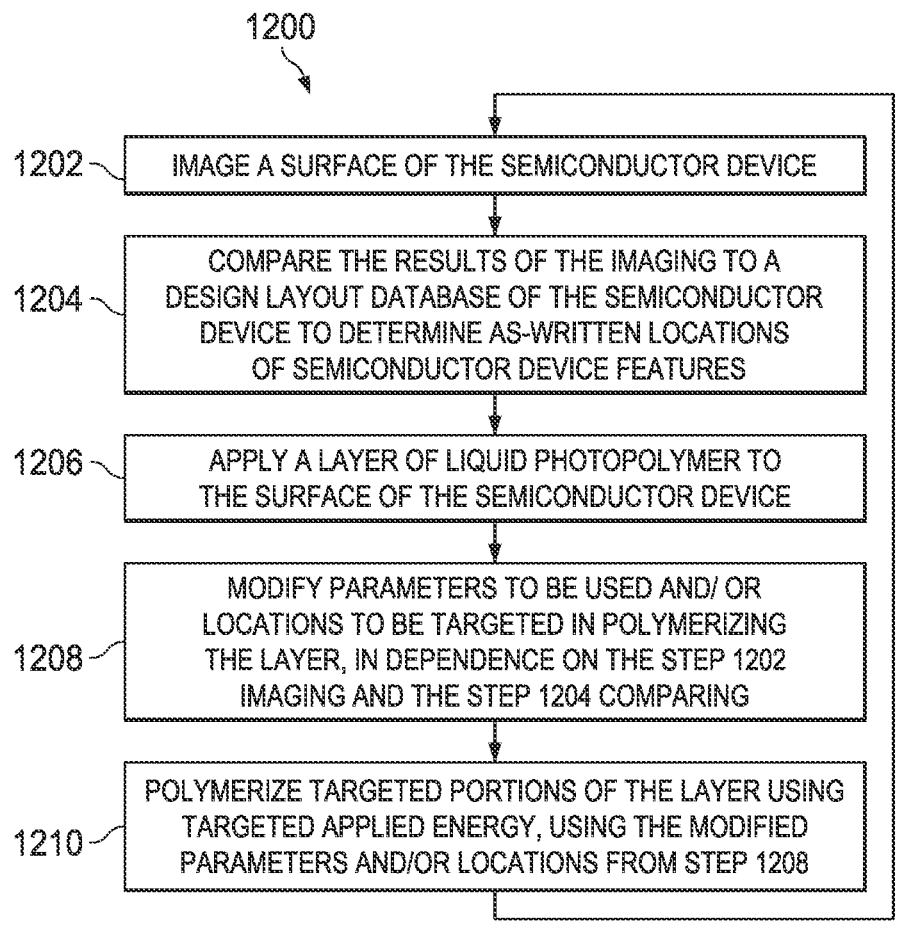
FIG. 12 shows an example of a process for encapsulating a semiconductor device using VP.

FIG. 12 shows an example of a process 1200 for encapsulating a semiconductor device 202 using VP. In step 1202, a surface of the semiconductor device 202 is imaged; for example, optically, acoustically, or using a charged particle beam. In step 1204, the results of the imaging are compared to a design layout database of the semiconductor device 202 to determine as-written locations of semiconductor device 202 features. By determining where semiconductor features have actually been written, encapsulation can be restricted to actual feature locations, rather than enclosing feature location tolerances. Accordingly, for example, if a device 202 has a 1 mm×1 mm pillar which is written with a 1 mm×1 mm tolerance, by imaging the device 202 prior to polymerizing a layer 204 of resin 106 around the pillar, the resin 106 can be polymerized around the more precise area resulting from the imaging (conforming to the 1 mm×1 mm pillar), rather than the 2 mm×2 mm potential write location of the pillar.

In step 1206, a layer 204 of liquid photopolymer 106 is applied to the surface of the semiconductor device 202. In step 1208, parameters to be used and/or locations to be targeted in polymerizing the layer 204 are modified, in dependence on the step 1202 imaging and the step 1204 comparing. Modified parameters can include, for example, light intensity, duration of light exposure, and location(s) of light illumination on the substrate. In step 1210, targeted portions of the layer 204 of liquid photopolymer resin 106 are polymerized using targeted applied energy, using the modified parameters and/or locations from step 1208, to form a specified layer 204 of solid polymerized resin 206 mechanically coupled to the semiconductor device 202. The process is repeated from step 1202 to form a specified three-dimensional shape encapsulating the semiconductor device.

The process 1200 can also include error correction to improve process fidelity from one layer 204 to a next layer 204. To accomplish this, the step 1202 imaging includes imaging the solid polymerized resin 206 produced in step 1210, and the step 1204 comparing includes comparing results of the imaging to a design layout database of the semiconductor device 202 and of the three-dimensional shape to locate placement errors of the solid polymerized resin 206. The modifying step then takes the results of this additional comparing into account to correct for polymerization process errors in future layers 204.

The described innovations, in various embodiments, provide one or more of at least the following advantages. However, not all of these advantages result from every one of the innovations described, and this list of advantages does not limit the scope of this description.

- Enables semiconductor device packaging with internal structure;
- enables physically functional structures in semiconductor device packaging;
- enables packaging that mitigates physical and thermal stress on packaged semiconductor devices;
- enables packaging of integrated circuits incorporating microfluidic channels;
- enables packaging of inductors with integrated circuits;
- enables packaging of antennae with integrated circuits;
- enables packaging of integrated circuits such that the packaging incorporates specified three dimensional structures; and
- enables packaging of integrated circuits such that the packaging incorporates specified metal-coated three dimensional structures.

Methods, devices and systems are described for packaging semiconductor devices using vat polymerization. Polymerization can be restricted to locations designated for illumination. Different polymers with different properties can be incorporated by encapsulating a semiconductor device using multiple different resins, different resins being located in different resin baths. Different polymers can be used to fabricate different 3D locations of the polymer encapsulation, enabling targeted positioning of material properties within layers of device-encapsulating material. Consequently, various functional structures can be fabricated within, on the surface of and through encapsulating polymerized resin.

Methods, devices and systems are described for using vat polymerization to fabricate functional structures for incorporation into semiconductor device packaging. A positive mold can be fabricated on a substrate. The positive mold can then be coated in a desired material, e.g., coated with metal using electroplating. The metallized structure is then thermally annealed onto metal pads on the substrate. After the substrate is cut, the metallized structure can be electrically connected to, and incorporated into the same encapsulating packaging as (e.g., using VP), a semiconductor device.

In some embodiments, a cavity created during encapsulation using VP can contain an object which is electrically or photonically functional (such as a reflective object).

In some embodiments, a ceramic can be used instead of a resin as encapsulation material.

In some embodiments, a full oxide shell can be used instead of a resin as encapsulation material.

In some embodiments, a method other than vat polymerization is used to encapsulate an IC.

In some embodiments, a surface of a lead frame or of a die can be treated, prior to VP encapsulation, with an adhesion promoter, to improve adhesion of polymerized resin to the treated lead frame or die.

In some embodiments, multiple dies can be encapsulated within the same overmold.

In some embodiments, vat polymerization can be used to create positive molds of interconnects, so that plating of such positive molds creates interconnects. Such interconnects can include, for example, connections between dies, connections between a die and a lead frame, and non-standard interconnects. Printable non-standard interconnect molds can be used to form, for example, twisted pair lines, or wires with impedance (inductance, capacitance, and/or resistance) selected by selecting a wire shape and/or size and/or material.

In some embodiments, a liquid encapsulation material (such as a polymerizable liquid) other than a photopolymer resin is used to perform vat polymerization, the liquid encapsulation material chosen to be subject to location-selectable curing by selective irradiation of the liquid encapsulation material.

In some embodiments, an irradiation energy source other than light, such as charged particles, is used to cure (solidify) a liquid encapsulation material. In some embodiments, parameters which can be modified in performing VP include intensity (amplitude) of applied energy, duration of irradiation, and location of irradiation.

In some embodiments, VP is used to form a button, for direct human interface, which is capable of toggling a state of an IC (by contact with the IC) when depressed (as further described with respect to FIG. 8). In some embodiments, VP is used to form another type of direct human interface, such as a toggle, switch, or slider, which is capable of changing a state of an IC (by contact with the IC) when interacted with by a user.

Modifications are possible in the described embodiments, and other embodiments are possible, within the scope of the claims.

What is claimed is:

1. A method comprising:
   immersing a substrate including at semiconductor die attached thereon in a liquid polymer material:
   irradiating part of the liquid polymer material to polymerize and to form a three- dimensional polymer structure on the substrate;
   coating the three-dimensional polymer structure with a metal to form a device;
   electrically connecting the device with the semiconductor die; and
   forming an integrated circuit by encapsulating the semiconductor die and the three- dimensional polymer structure in a package.

2. The method of claim 1, wherein the three-dimensional polymer structure is formed in layers of the polymerized liquid polymer material by moving the substrate relative to a source of irradiation.

3. The method of claim 1, further comprising annealing the metal to electrically connect the device with the integrated circuit.

4. The method of claim 1, wherein the encapsulating includes vat polymerization.

5. The method of claim 1, a wherein the liquid polymer material includes a catalyst selected to facilitate the coating.

6. The method of claim I, wherein the device includes an inductor.

7. The method of claim 1, wherein the device includes an antenna.

8. The method of claim 1, wherein encapsulating the integrated circuit and the three-dimensional polymer structure in a package comprises forming a cavity around at least a part of the device.

9. The method of claim 1, further comprising coating the metal with an insulator.

10. A method comprising:
   immersing a substrate in a liquid polymer material in a container, the container having a bottom, the substrate further including a semiconductor die attached thereon;
   irradiating part of the liquid polymer material via the bottom of the container to polymerize and to form a three-dimensional polymer structure on the substrate;
   separating the three-dimensional polymer structure from a surface of the bottom of the container; and
   encapsulating the semiconductor die and the three-dimensional polymer structure in a package to form an integrated circuit.

11. The method of claim 10, wherein the surface of the bottom of the container includes at least one of: an oxygen permeable glass. or a polymerization inhibitor.

12. The method of claim 10, further comprising coating the three-dimensional polymer structure with a metal to form a device.

13. The method of claim 12, wherein the device includes an inductor.

14. The method of claim 12, wherein the device includes an antenna.

15. The method of claim 10, wherein encapsulating the integrated circuit and the three-dimensional polymer structure in a package comprises forming a cavity around at least a part of the polymer three-dimensional structure.

16. The method of claim 10, wherein the three-dimensional polymer structure is formed in layers of the polymerized liquid polymer material by moving the substrate relative to a source of irradiation.

* * * * *